June 11, 1968 J. D. BABB 3,388,210

PRINTED CIRCUIT BOARD ADAPTER

Filed March 9, 1967

INVENTOR.
JACK D. BABB
BY Trask, Jenkins & Hanley
ATTORNEYS

United States Patent Office 3,388,210
Patented June 11, 1968

3,388,210

PRINTED CIRCUIT BOARD ADAPTER

Jack D. Babb, Columbus, Ind., assignor to Arvin Industries, Inc., Columbus, Ind., a corporation of Indiana Filed Mar. 9, 1967, Ser. No. 621,995
6 Claims. (Cl. 174—138)

ABSTRACT OF THE DISCLOSURE

An adapter for use with a multi-lead electronic device and printed circuit board, said adapter having V-shaped notches for guiding said leads through openings in the adapter into aligned openings in the printed circuit board.

*Summary of the invention*

A problem has long existed in the electronics field where it is sometimes necessary in an assembly procedure to insert the many small conductor leads of an electronic device into the small openings of a receptacle such as a printed circuit (PC) board. It is time consuming to make the necessary insertion if the leads become slightly misaligned or bent.

In accordance with the invention, there is provided an adapter for use in connecting a multi-lead electronic device to a PC board. Said adapter has a plurality of V-shaped notches formed therein which terminate at their apexes in a plurality of openings in spaced relation to register with openings formed in the PC board. Thus, a multi-lead electronic device whose leads are not in perfect alignment with the board openings may be placed over the adapter with each lead inserted onto one of the V-shaped notches. As the leads are moved further into the adapter, they are guided by the walls of the notches through adapter openings and into the board openings.

*Brief description of the drawing*

The accompanying drawing illustrates the invention. In such drawing.

*Detailed description*

Figure 1:
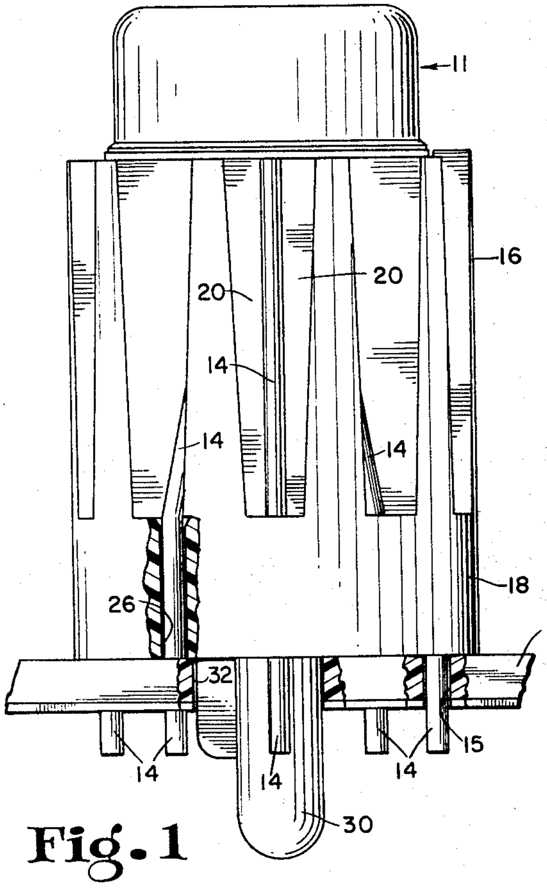
FIG. 1 is a side elevation of an adapter embodying the invention and showing said adapter in use with an electronic device and PC board.
Figure 2:
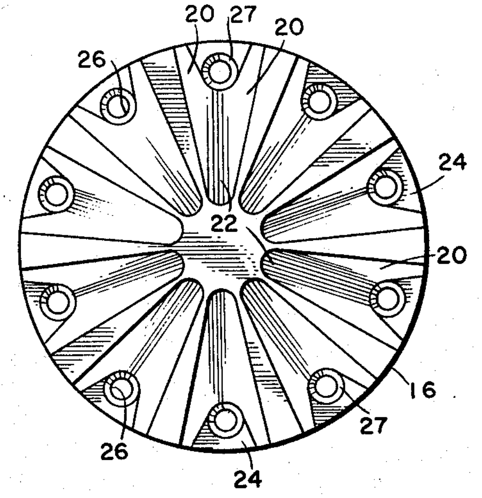
FIG. 2 is a top plan view of the adapter shown in FIG. 1.

As shown in FIG. 1, my adapter is adapted to facilitate mounting an electronic device 11, such as an integrated circuit housed in a conventional package, onto a receptacle, such as a PC board 12. In this regard, it brings the pliable leads 14 on the device into registry with the PC board openings 15 so that said leads can be quickly and easily inserted into the openings and connected to the desired circuit paths on the board.

The adapter, which is formed of an electrical insulating material, can be formed as a plastic molding. As shown, said adapter comprises an upper guide section 16 connected to a base 18 adapted to be supported against the PC board 12. Said guide section has a plurality of generally V-shaped notches extending from its outer end to the base 18 and adapted to receive the leads 14 and guide them into the PC board openings 15. Each of said notches has a pair of generally triangularly shaped side walls 20 having a common inner edge 22. The walls 20 diverge outwardly from the edge 22 to the side of the adapter whereby said notches are open at the sides of the adapter. Said walls also diverge outwardly from the base 18 to the upper end of the guide section to provide each notch with a large lead-receiving mouth at the upper end of the guide section. The walls 20 have their greatest widths at the top of the section 18, and the edge 22 thus angles outwardly toward the side of the adapter from the upper to the lower end of the notch.

Figure 3:
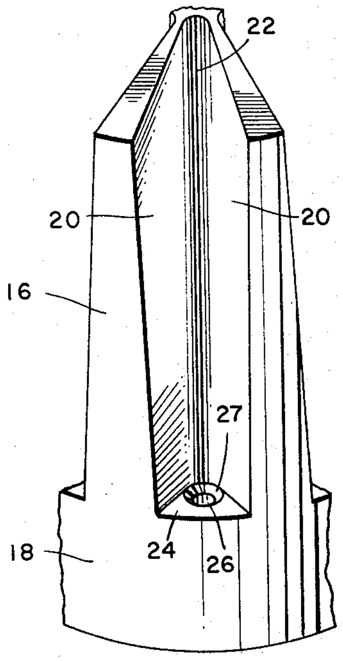
FIG. 3 is an enlarged perspective view of a portion of the adapter shown in FIG. 1 showing one of the adapter notches.

As shown in FIG. 3 the lower end of each of the notches is defined by a generally triangularly shaped section 24 of the base 18, and an opening 26 extends through said base at the juncture of each of the edges 22 and its associated base section 24. The leads 14 will slide down the edge 22 as they are inserted into the notches, and to guide them into the openings 26, said openings are enlarged at their junctures with said edges, as at 27, and said edges extend into said openings.

In order to locate the adapter openings 26 in registry with the PC board openings 15, a key-shaped lug 30 projects downwardly from the base 18 for reception in a key-hole shaped opening 32 in the PC board. Thus, when the lug 30 is received in the opening 32, the adapter will be indexed with respect to the board to align the openings 26 and 15 so that the leads 14 can be easily inserted into the adapter notches and through said openings. Because of their wide mouths and tapered configuration, the notches will easily guide the pliable leads 14 into the base openings 26 and thus the PC board openings 15.

I claim:

1. An adapter for aligning a plurality of conductor leads with a plurality of openings in a receptacle, comprising a base section adapted to be supported on said receptacle, a guide section joined to said base and projecting outwardly therefrom, said guide section having a plurality of generally V-shaped notches formed in its outer wall, said notches converging from the end of said guide section remote from said base toward said base, and said base having openings extending therethrough inwardly from its edges and at the apexes of said notches.

2. An adapter for aligning a plurality of conductor leads with a plurality of openings in a receptacle, comprising a base section adapted to be supported on said receptacle, a guide section joined to said base and projecting outwardly therefrom, said guide section having a plurality of generally V-shaped notches formed in its outer wall, said notches converging from the end of said guide section remote from said base toward said base, said base having openings extending therethrough inwardly from its edges and at the apexes of said notches and indexing means on said base engageable with said board for aligning the openings in said base and board.

3. The invention as set forth in claim 2 in which said indexing means comprises a lug projecting outwardly from the base remote from said guide section for reception in an opening in said receptacle, said lug and opening being contoured to permit only axial movement of said lug with respect to said opening.

4. An adapter for aligning a plurality of conductor leads with a plurality of openings in a receptacle, comprising a base section adapted to be supported on said receptacle, a guide section joined to said base and projecting outwardly therefrom, said guide section having a plurality of generally V-shaped notches formed in its outer wall, said notches extending from said base to the opposite end of said guide section, each of said notches having a pair of side walls diverging outwardly from a common side edge and said edge angling outwardly toward the side of said guide section from its said opposite end to said base, and said base having an opening extending therethrough inwardly from its edges and at its juncture with each of said edges.

5. The invention as set forth in claim 4 with the addition that each pair of said side walls diverges outwardly from said base toward said opposite guide section end.

6. The invention as set forth in claim 4 in which said openings are enlarged at their junctures with said edges.

References Cited

UNITED STATES PATENTS

| | | | |
|---|---|---|---|
| D. 200,157 | 1/1965 | Vincent. | |
| 2,483,351 | 9/1949 | Richardson. | |
| 2,498,378 | 2/1950 | Phelps | 339—186 X |
| 3,107,963 | 10/1963 | Hansen. | |
| 3,184,536 | 5/1965 | Vincent | 174—138.5 |
| 3,286,132 | 11/1966 | Turner | 174—138.5 X |

FOREIGN PATENTS

| | | |
|---|---|---|
| 549,530 | 12/1957 | Canada. |

LARAMIE E. ASKIN, *Primary Examiner.*